US010361664B2

United States Patent
Matsui et al.

(10) Patent No.: US 10,361,664 B2
(45) Date of Patent: Jul. 23, 2019

(54) POWER AMPLIFIER CIRCUIT

(71) Applicant: Murata Manufacturing Co., Ltd., Kyoto (JP)

(72) Inventors: Toshiki Matsui, Kyoto (JP); Kenji Sasaki, Kyoto (JP); Fumio Harima, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/002,457

(22) Filed: Jun. 7, 2018

(65) Prior Publication Data

US 2018/0358933 A1    Dec. 13, 2018

Related U.S. Application Data

(60) Provisional application No. 62/516,811, filed on Jun. 8, 2017.

(51) Int. Cl.
*H03F 1/30*    (2006.01)
*H03F 1/02*    (2006.01)
(Continued)

(52) U.S. Cl.
CPC ......... *H03F 1/302* (2013.01); *H01L 29/7304* (2013.01); *H01L 29/7371* (2013.01);
(Continued)

(58) Field of Classification Search
CPC .................................................. H03F 1/302
(Continued)

(56) References Cited

U.S. PATENT DOCUMENTS 3,517,267 A * 6/1970 Ferrieu ................ H03D 1/18
                                                    327/72
6,686,801 B1    2/2004 Cho et al.
(Continued)

FOREIGN PATENT DOCUMENTS

KR    10-1999-0083465 A    11/1999
TW         200402188 A      2/2004

OTHER PUBLICATIONS

Chen, et al., A Stage-Scaled Distributed Power Amplifier Achieving 110GHz Bandwidth and 1.75dBm Peat Output Power, 2010 IEEE Radio Frequency Intergrated Circuits Symposium, 2010, pp. 347-350, IEEE, Conference Location Anaheim, CA, USA.

*Primary Examiner* — Patricia T Nguyen
(74) *Attorney, Agent, or Firm* — Pearne & Gordon LLP (57) ABSTRACT

A power amplifier circuit is capable of restraining uneven temperature distribution among a plurality of unit transistors while restraining the deterioration of the characteristics of the power amplifier circuit. The power amplifier circuit includes: a first transistor group which includes a plurality of unit transistors and which amplifies an input signal and outputs an amplified signal; a bias circuit which supplies a bias current or a bias voltage to a base or a gate of each unit transistor of the first transistor group; a plurality of first resistive elements, each of which is connected between the base or the gate of each unit transistor of the first transistor group and an output of the bias circuit; and a plurality of second resistive elements, each of which is connected between an emitter or a source of each unit transistor of the first transistor group and a reference potential.

15 Claims, 11 Drawing Sheets

(51) Int. Cl.
*H03F 3/21* (2006.01)
*H03F 3/19* (2006.01)
*H01L 29/737* (2006.01)
*H01L 29/73* (2006.01)

(52) U.S. Cl.
CPC ............ *H03F 1/0205* (2013.01); *H03F 3/19* (2013.01); *H03F 3/21* (2013.01); *H03F 2200/21* (2013.01); *H03F 2200/447* (2013.01); *H03F 2200/451* (2013.01)

(58) Field of Classification Search
USPC ......................................................... 330/133
See application file for complete search history.

(56) References Cited

U.S. PATENT DOCUMENTS

| | | | | |
|---|---|---|---|---|
| 7,157,972 | B2 * | 1/2007 | Hajimiri | ................ H03F 3/193 |
| | | | | 330/277 |
| 2002/0055376 | A1 | 5/2002 | Norimatsu | |
| 2004/0113699 | A1 * | 6/2004 | Kondo | ................... H03F 1/302 |
| | | | | 330/295 |
| 2009/0295483 | A1 | 12/2009 | Alidio et al. | |
| 2010/0066452 | A1 * | 3/2010 | Kawashima | .............. H03F 1/26 |
| | | | | 330/293 |
| 2012/0200359 | A1 * | 8/2012 | Karthaus | ................ H03F 1/302 |
| | | | | 330/291 |
| 2013/0137383 | A1 * | 5/2013 | Kobayashi | ............... H03F 1/34 |
| | | | | 455/77 |

* cited by examiner

POWER AMPLIFIER CIRCUIT

This application claims priority to U.S. Provisional Application Ser. No. 62/516,811, filed on Jun. 8, 2017, entitled "POWER AMPLIFIER", the entirety of which is incorporated herein by reference.

BACKGROUND

Field

The present invention relates to a power amplifier circuit.

Description of Related Art

A power amplifier circuit mounted in mobile communication equipment, such as a cellular phone, usually uses a bipolar transistor as an amplifier. The bipolar transistor has a thermal positive feedback characteristic, in which, as the temperature of a transistor device increases, a collector current increases, causing the temperature to further rise with a resultant increase in the collector current. Hence, if, for example, a bipolar transistor is composed of a plurality of unit transistors, then the occurrence of temperature differences among the unit transistors causes a unit transistor having a relatively high temperature to undesirably draw in the collector currents of other unit transistors. This may consequently lead to the occurrence of a phenomenon known as a current collapse phenomenon, in which the collector current of the entire transistor group composed of the plurality of unit transistors decreases.

There has been known, therefore, a configuration in which, for example, a resistive element (hereinafter referred to also as "the emitter ballast resistor") is inserted between the emitter of each unit transistor and ground to restrain an increase in temperature of each unit transistor. The insertion of the emitter ballast resistor makes it possible to restrain uneven temperature distribution among the plurality of unit transistors, thus avoiding the occurrence of the current collapse phenomenon.

The effect of such an emitter ballast resistor to restrain uneven temperature distribution decreases unless the emitter ballast resistor has a resistance value of a certain level or more. However, if the resistance value of the emitter ballast resistor is excessively large, then the output power of the power amplifier circuit may decrease or power added efficiency may deteriorate.

SUMMARY

The present invention has been made in view of the circumstances described above, and it is an object of the invention to provide a power amplifier circuit capable of restraining uneven temperature distribution among a plurality of unit transistors while restraining deterioration of the characteristics of the power amplifier circuit.

To this end, a power amplifier circuit according to an aspect of the present invention includes: a first transistor group which includes a plurality of unit transistors and which amplifies an input signal and outputs an amplified signal; a bias circuit which supplies a bias current or a bias voltage to a base or a gate of each unit transistor of the first transistor group; a plurality of first resistive elements, each of which is connected between the base or the gate of each unit transistor of the first transistor group and an output of the bias circuit; and a plurality of second resistive elements, each of which is connected between an emitter or a source of each unit transistor of the first transistor group and a reference potential.

According to the present invention, it is possible to provide a power amplifier circuit capable of restraining uneven temperature distribution among a plurality of unit transistors while restraining the deterioration of the characteristics of the power amplifier circuit.

DETAILED DESCRIPTION

The following will describe an embodiment of the present invention with reference to the accompanying drawings. The same elements will be assigned the same reference numerals and the descriptions will not be repeated.

Figure 1:
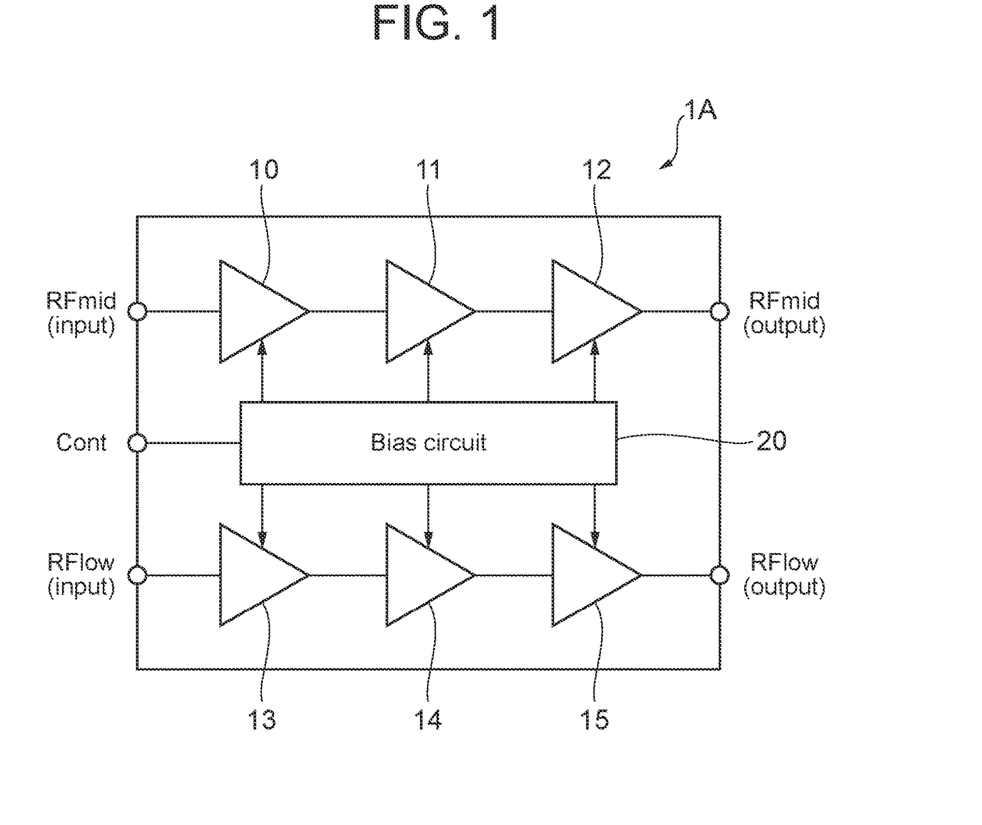
FIG. 1 is a diagram illustrating a configuration example of a power amplifier circuit according to a first embodiment of the present invention.

FIG. 1 is a diagram illustrating a configuration example of a power amplifier circuit according to a first embodiment of the present invention. A power amplifier circuit 1A illustrated in FIG. 1 is, for example, installed in a cellular phone and used to amplify the power of radio frequency (RF) signals transmitted to a base station. The communication standards for the RF signals to be amplified include, for example, the second generation mobile communication system (2G), the third generation mobile communication system (3G), the fourth generation mobile communication system (4G), the fifth generation mobile communication system (5G), the long term evolution (LTE)-frequency division duplex (FDD), the LTE-time division duplex (TDD), the LTE-Advanced, and LTE-Advanced Pro. The communication standards for the signals to be amplified by the power amplifier circuit 1A are not limited to the above.

The power amplifier circuit 1A has, for example, two amplification paths. To be specific, the power amplifier circuit 1A includes amplifiers 10 to 12 constituting a first path, amplifiers 13 to 15 constituting a second path, and a bias circuit 20 that supplies a bias current or a bias voltage to the amplifiers 10 to 15.

Input to the first path is, for example, a middle band RF signal RFmid, and the power thereof is amplified through the amplifier 10 in a first stage, the amplifier 11 in a second stage, and the amplifier 12 in a third stage. Input to the second path is, for example, a low-band RF signal RFlow, and the power thereof is amplified through the amplifier 13 of the first stage, the amplifier 14 of the second stage, and the amplifier 15 of the third stage. Further, a control signal Cont for controlling the bias current or the bias voltage is supplied to the bias circuit 20. It should be noted that the foregoing frequency bands of the signals supplied to the first path and the second path are examples, and are not limited thereto. For example, a combination of a high band and a middle band, or a combination of a high band and a low band may be used. Further alternatively, a combination of different communication standards, such as a combination of LTE and 5G or a combination of 4G and 5G, may be applied.

Figure 2:
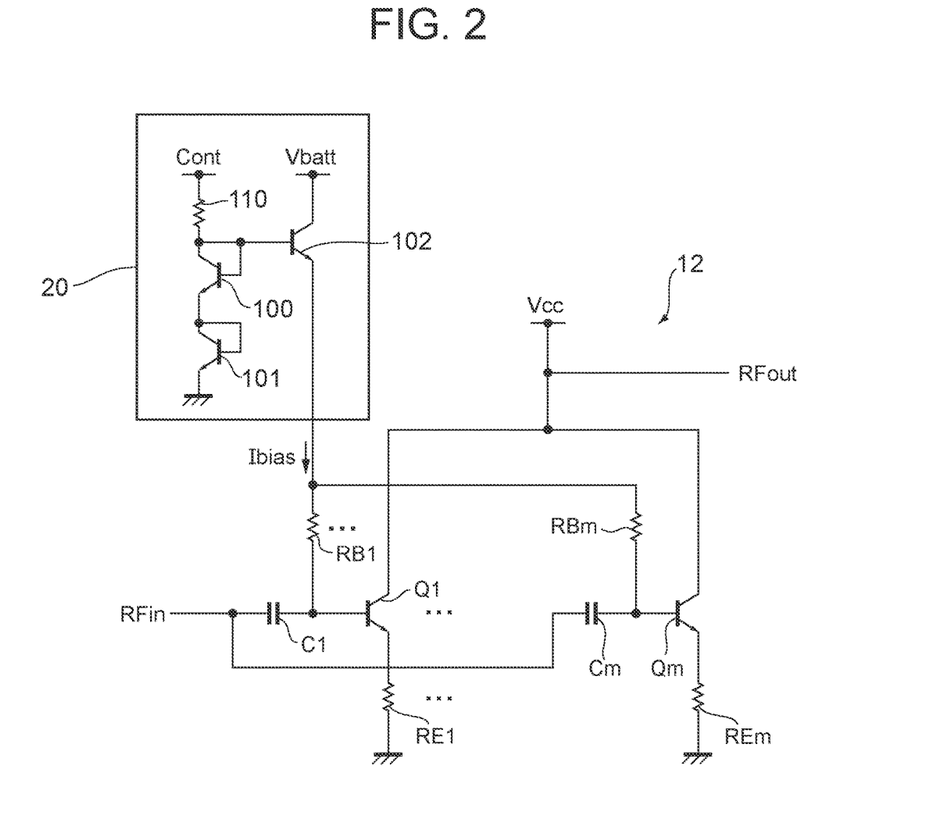
FIG. 2 is a diagram illustrating an example of a circuit diagram of amplifiers and a bias circuit included in the power amplifier circuit according to the first embodiment of the present invention.

FIG. 2 is a diagram illustrating an example of the circuit diagram of the amplifiers and the bias circuit included in the power amplifier circuit according to the first embodiment of the present invention. To be specific, FIG. 2 illustrates the specific configurations of the amplifier 12 in the third stage of the first path and the bias circuit 20 illustrated in FIG. 1.

The amplifier 12 includes a transistor group (a first transistor group) which includes, for example, an m number (m being an integer of 1 or more) of unit transistors Q1 to Qm, the m number of capacitive elements C1 to Cm, the m number of resistive elements RE1 to REm, and the m number of resistive elements RB1 to RBm. In the present specification, the term "unit transistor" means a minimum constituent that exerts a function as a transistor.

The unit transistors Q1 to Qm constitute a bipolar transistor, such as a heterojunction bipolar transistor (HBT). These unit transistors Q1 to Qm are interconnected in parallel to function together as a single transistor. In each of the unit transistors Q1 to Qm, a supply voltage Vcc is supplied to the collector, an RF signal RFin (input signal) is supplied to the base via the capacitive elements C1 to Cm, and a reference potential (e.g., a ground potential) is supplied to the emitter via the resistive elements RE1 to REm. Further, a bias current Ibias is supplied from the bias circuit 20 to the bases of the unit transistors Q1 to Qm. Thus, the unit transistors Q1 to Qm amplify the power of the RF signal RFin and outputs an RF signal RFout (amplified signal). The unit transistors Q1 to Qm may alternatively be unit transistors constituting a field-effect transistor, such as a metal-oxide semiconductor field-effect transistor (MOSFET), in place of the bipolar transistor. In this case, the collector, the base and the emitter are to be replaced with the drain, the gate and the source.

One end of each of the capacitive elements C1 to Cm receives the RF signal RFin, and the other end thereof is connected to the base of each of the unit transistors Q1 to Qm. The capacitive elements C1 to Cm blocks the DC component of the RF signal RFin and allow the AC component to pass therethrough.

One end of each of the resistive elements RB1 to RBm (the first resistive elements) receives the bias current from the bias circuit 20, and the other end thereof is connected to the base of each of the unit transistors Q1 to Qm. In other words, the resistive elements RB1 to RBm are ballast resistors inserted between the bias circuit 20 and the bases of the unit transistors Q1 to Qm (hereinafter referred to also as "the base ballast resistors").

One end of each of the resistive elements RE1 to REm (the second resistive elements) is connected to the emitter of each of the unit transistors Q1 to Qm, and the other end thereof is connected to the ground. In other words, the resistive elements RE1 to REm are emitter ballast resistors inserted between the emitters of the unit transistors Q1 to Qm and the ground. The effects of the resistive elements RB1 to RBm and the resistive elements RE1 to REm will be described later.

The bias circuit 20 includes, for example, transistors 100 to 102 and a resistive element 110.

The transistors 100 to 102 are, for example, bipolar transistors. To be specific, in the transistor 100, the collector and the base are connected (hereinafter referred to also as "the diode-connected"), a control signal Cont is supplied to the collector thereof via the resistive element 110, and the emitter is connected to the collector of the transistor 101. The transistor 101 is diode-connected, and the emitter thereof is grounded. Thus, a voltage of a predetermined level (e.g., approximately 2.6 V) is generated at the collector of the transistor 100.

In the transistor 102, a battery voltage Vbatt is supplied to the collector, the base is connected to the collector (the base) of the transistor 100, which is diode-connected, and the emitter is connected to one end of each of the resistive elements RB1 to RBm. The control signal Cont and the collector voltage of the transistor 100 are supplied to the base of the transistor 102. Thus, the bias current Ibias based on the control signal Cont is output from the emitter of the transistor 102. The control signal Cont may be a control current or a control voltage. Further, the transistors 100 and 101 may be diodes in place of the transistors.

A description will now be given of the effects obtained by the power amplifier circuit 1A being provided with both the resistive elements RE1 to REm (the emitter ballast resistors) and the resistive elements RB1 to RBm (the base ballast resistors). In general, a bipolar transistor has a negative temperature characteristic, in which the voltage between the base and the emitter, which causes the transistor to turn on, drops as the temperature increases. Further, the bipolar transistor also has a thermal positive feedback characteristic, in which the collector current increases as the temperature rises, causing the temperature to further rise with a resultant further increase in the collector current. Hence, in a transistor group composed of, for example, a plurality of unit transistors, if a temperature difference occurs among the unit transistors due to the difference in the degree of heat dissipation attributable to the layout of the unit transistors, then more current tends to flow into the unit transistors having higher temperatures, thus causing the unit transistors to have even higher temperatures. Thus, as the temperature difference between the unit transistors having higher temperatures and the unit transistors having lower temperatures increases, then the unit transistors having higher temperatures will undesirably draw in the collector current of the remaining unit transistors, resulting in insufficient current flowing into the remaining unit transistors. This leads to a rapid decrease of the gains of the remaining unit transistors, and the current collapse phenomenon may consequently take place, in which the total collector current of the entire transistor group composed of the plurality of unit transistors rapidly decreases.

There has been known, for example, a configuration in which an emitter ballast resistor is inserted between the emitter of each of the unit transistors and the ground in order to avoid the occurrence of the current collapse phenomenon. In general, if the resistance value of the emitter ballast resistor is sufficiently large, then the difference in temperature among the plurality of unit transistors can be restrained, thus avoiding the occurrence of the current collapse phenomenon. However, if the resistance value of the emitter ballast resistor is excessively large, then the output power of the power amplifier circuit may decrease or power added efficiency may deteriorate.

Figure 3:
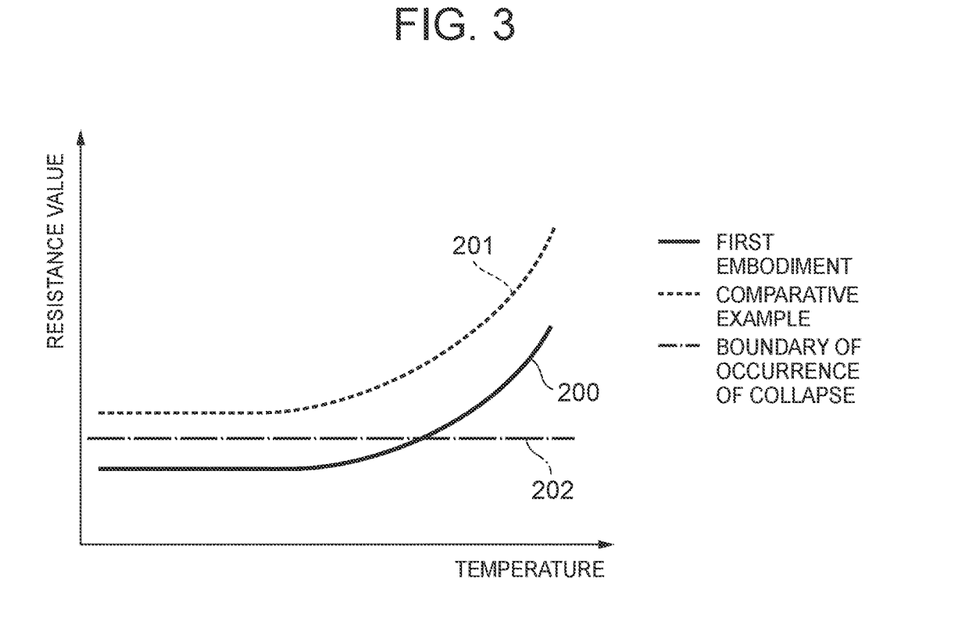
FIG. 3 is a graph with a simplified illustration of the temperature characteristics of an emitter ballast resistor.

FIG. 3 is a graph with a simplified illustration of the temperature characteristics of the emitter ballast resistor. In the graph, the horizontal axis indicates temperature and the vertical axis indicates resistance value. The graph illustrates a temperature characteristic 200 of the resistance value of the emitter ballast resistor (the resistive elements RE1 to REm), a temperature characteristic 201 of the resistance value of an emitter ballast resistor according to a comparative example not provided with the base ballast resistor, and a boundary line 202 of the resistance value of the emitter ballast resistor, beyond which the current collapse phenomenon occurs in an ordinary temperature environment. In other words, the graph indicates that, if a resistance value is higher than the boundary line 202, then the occurrence of the current collapse phenomenon can be avoided, whereas the current collapse phenomenon may occur if the resistance value is lower than the boundary line 202.

As indicated by the temperature characteristic 201, the resistance value of the emitter ballast resistor of the comparative example is designed to exceed the boundary line 202, so that the occurrence of the current collapse phenomenon can be avoided at any temperature. In contrast, as indicated by the temperature characteristic 200, the resistance value of the emitter ballast resistor of the present embodiment is designed to be smaller than the resistance value of the emitter ballast resistor of the comparative example, so that the temperature is below the boundary line 202 in a range in which the temperature is relative low, leading to the possibility of the occurrence of the current collapse phenomenon.

However, the present embodiment has both the emitter ballast resistors and the base ballast resistors, thereby restraining a temperature rise in the unit transistors by these two types of resistive elements. More specifically, even if the resistance values of the emitter ballast resistors are smaller than the resistance values of the emitter ballast resistors of the comparative example, a temperature rise in the unit transistors can be restrained. Hence, the present embodiment makes it possible to restrain a decrease in output power of the power amplifier circuit and the deterioration of the characteristic of power added efficiency and to also restrain uneven temperature distribution among a plurality of unit transistors, thus avoiding the occurrence of the current collapse phenomenon.

Figure 4A:
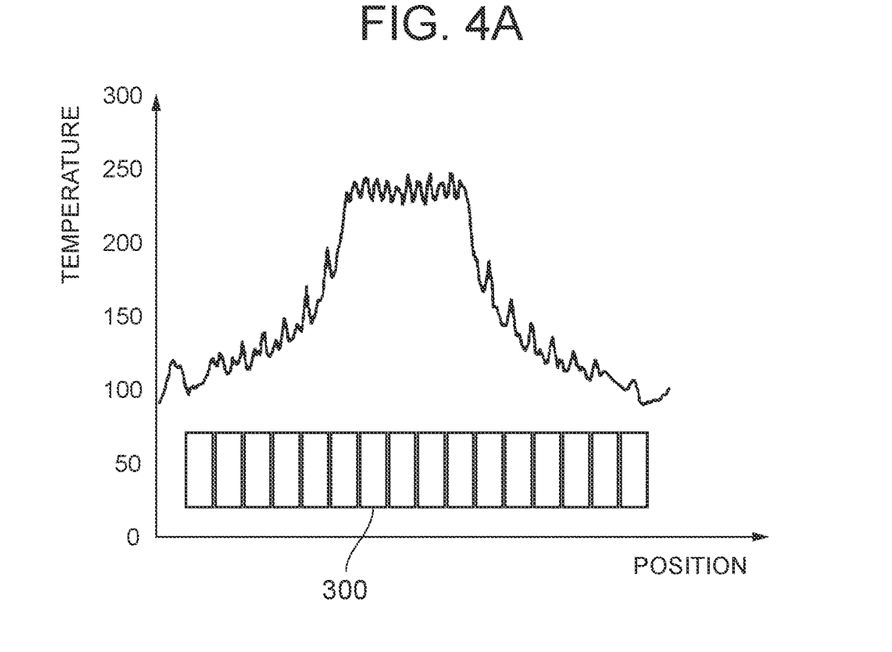
FIG. 4A is a graph illustrating an example of the simulation result of the temperature distribution of a plurality of unit transistors included in a power amplifier circuit according to a comparative example.
Figure 4B:
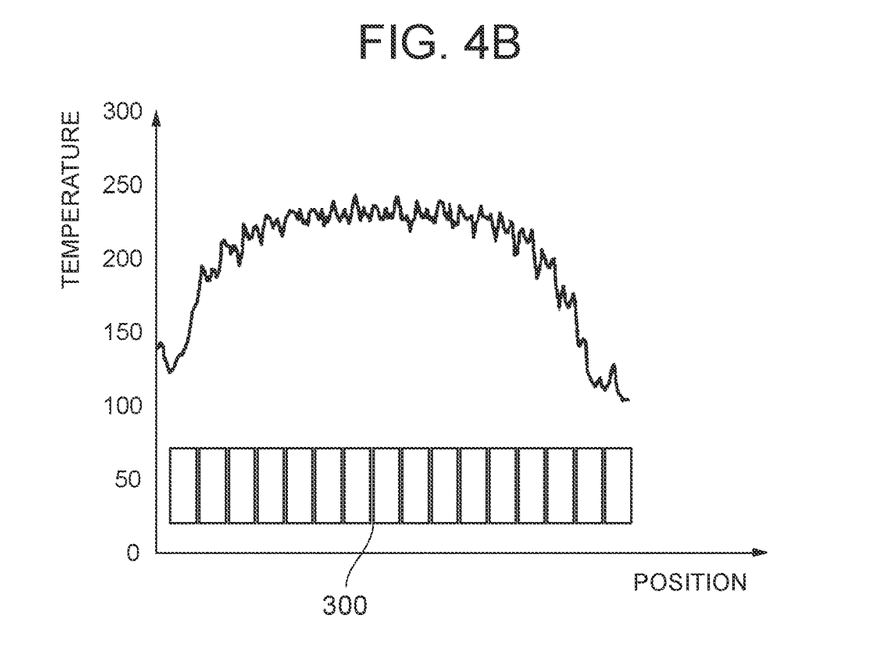
FIG. 4B is a graph illustrating an example of the simulation result of the temperature distribution of a plurality of unit transistors included in a power amplifier circuit according to a first embodiment of the present invention.

FIG. 4A is a graph illustrating an example of the simulation result of the temperature distribution of a plurality of unit transistors included in a power amplifier circuit according to a comparative example. FIG. 4B is a graph illustrating an example of the simulation result of the temperature distribution of a plurality of unit transistors included in a power amplifier circuit according to the first embodiment of the present invention. To be specific, the graphs in FIG. 4A and FIG. 4B illustrate simulation results of the temperatures at positions in a transistor group 300, in which sixteen unit transistors are aligned in one direction, in both the comparative example and the present invention, as illustrated at the lower parts of the graphs in FIG. 4A and FIG. 4B. In each graph, the horizontal axis indicates the positions of the unit transistors in the direction of alignment, and the vertical axis indicates temperature.

As illustrated in FIG. 4A, in the comparative example, the temperatures of the four unit transistors in a central area among the sixteen unit transistors are approximately 250 degrees, whereas the temperatures of the twelve unit transistors in the surrounding areas are approximately 100 degrees. It is therefore understood that, in the comparative example, there is a significant temperature difference between the unit transistors in the central area and the unit transistors in the surrounding areas, resulting in uneven temperature distribution. On the other hand, as illustrated in FIG. 4B, in the present embodiment, the temperatures of many unit transistors among the sixteen unit transistors are in the range of approximately 200 to 250 degrees. It is therefore understood that, the unevenness of the temperature distribution among the plurality of unit transistors is restrained in the present embodiment, as compared with the comparative example.

As a configuration (reference example) that is different from the power amplifier circuit 1A, a configuration adapted to restrain uneven temperature distribution by the base ballast resistors without using the emitter ballast resistors is also conceivable. However, in the case of the reference example, the resistance value of a base ballast resistor has to be set to β-times (β denoting the current amplification factor of a transistor) the resistance value of an emitter ballast resistor in the configuration without the base ballast resistor. In the reference example, therefore, the sizes of the resistive elements may increase with a consequent increase of a chip area. In this respect, the present embodiment is provided with both the emitter ballast resistors and the base ballast resistors, so that the uneven temperature distribution can be restrained while restraining an increase in the chip area, as compared with the reference example.

Figure 5:
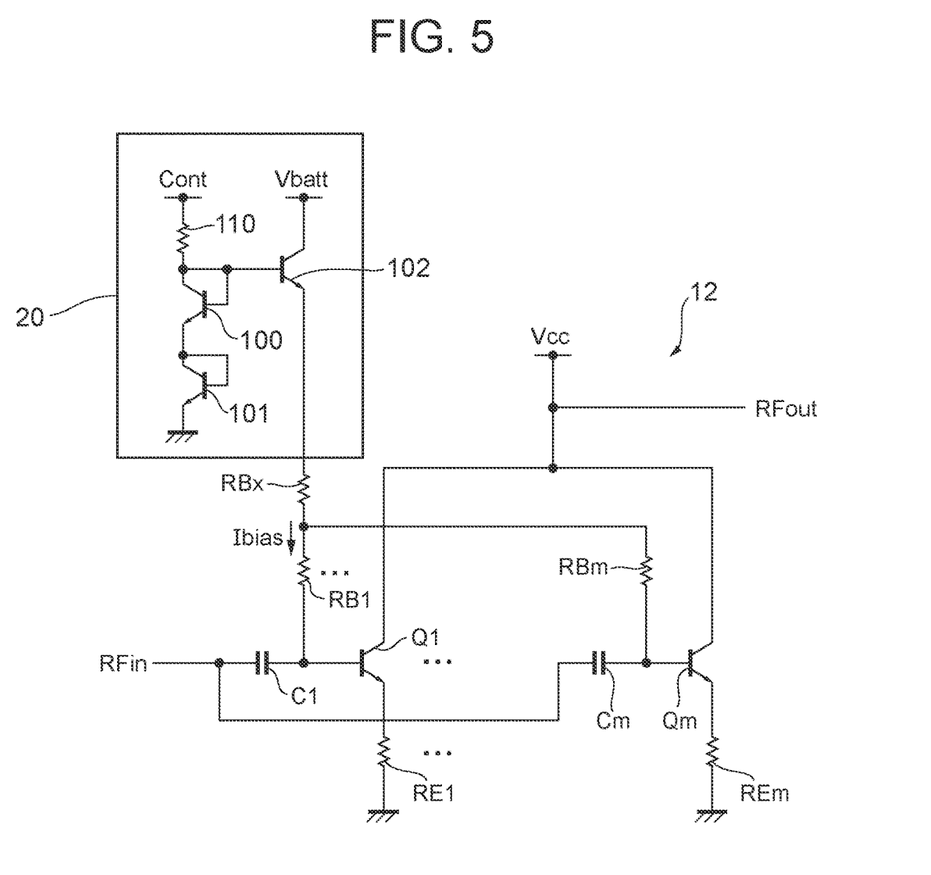
FIG. 5 is a diagram illustrating an example of the circuit diagram of an amplifier and a bias circuit included in a power amplifier circuit according to a modification example of the first embodiment of the present invention.

FIG. 5 is a diagram illustrating an example of the circuit diagram of the amplifier and the bias circuit included in the power amplifier circuit according to a modification example of the first embodiment of the present invention. The same elements as those in the configuration illustrated in FIG. 2 will be assigned the same reference numerals and the descriptions thereof will be omitted. In the present embodiment and after, the descriptions of the same aspects as those of the first embodiment will be omitted, and only different aspects will be described. In particular, the same operation and effect as those obtained by the same configuration will not be described one by one for each embodiment.

The configuration of the modification example illustrated in FIG. 5 differs from the configuration illustrated in FIG. 2 in that a resistive element RBx is provided in addition to the resistive elements RB1 to RBm. More specifically, in the present modification example, a part of the resistance value required for the base ballast resistors is allocated to the resistive element RBx, and the rest of the resistance value is allocated to the resistive elements RB1 to RBm. Hence, the sizes of the resistive elements RB1 to RBm are smaller than those in the configuration illustrated in FIG. 2, thus making it possible to reduce the chip area.

As described above, the configuration of the base ballast resistor is not limited to the configuration illustrated in FIG. 2, and some or all of the base ballast resistors may be commonalized.

Figure 6:
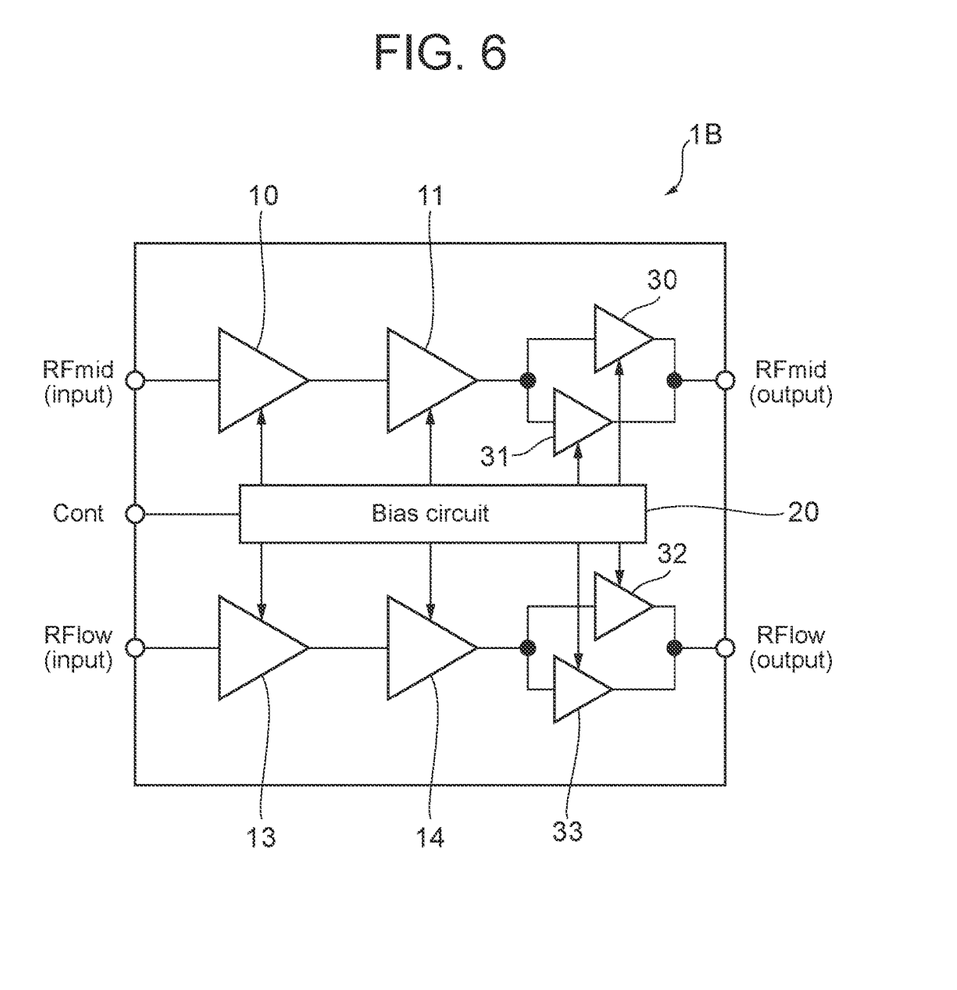
FIG. 6 is a diagram illustrating a configuration example of a power amplifier circuit according to a second embodiment of the present invention.

FIG. 6 is a diagram illustrating a configuration example of a power amplifier circuit according to a second embodiment of the present invention. A power amplifier circuit 1B illustrated in FIG. 6 differs from the power amplifier circuit 1A illustrated in FIG. 1 in that both the first path and the second path are provided with two systems of amplifiers in the third stage.

To be specific, the power amplifier circuit 1B has amplifiers 30 and 31 in place of the amplifier 12, and also has amplifiers 32 and 33 in place of the amplifier 15. The amplifier 30 and the amplifier 31, and the amplifier 32 and the amplifier 33 are appropriately used according to the operation mode of the power amplifier circuit 1B. More specifically, an example of the first path of a middle band will be described. For example, if the power amplifier circuit 1B is in a high power mode (a first mode) for outputting power of a predetermined level or more, then both the amplifiers 30 and 31 will be turned on, and if the power amplifier circuit 1B is in a low power mode (a second mode) for outputting power below the predetermined level, then the amplifier 30 will be turned off and only the amplifier 31 will be turned on. This restrains the consumption of more than necessary power.

Figure 7:
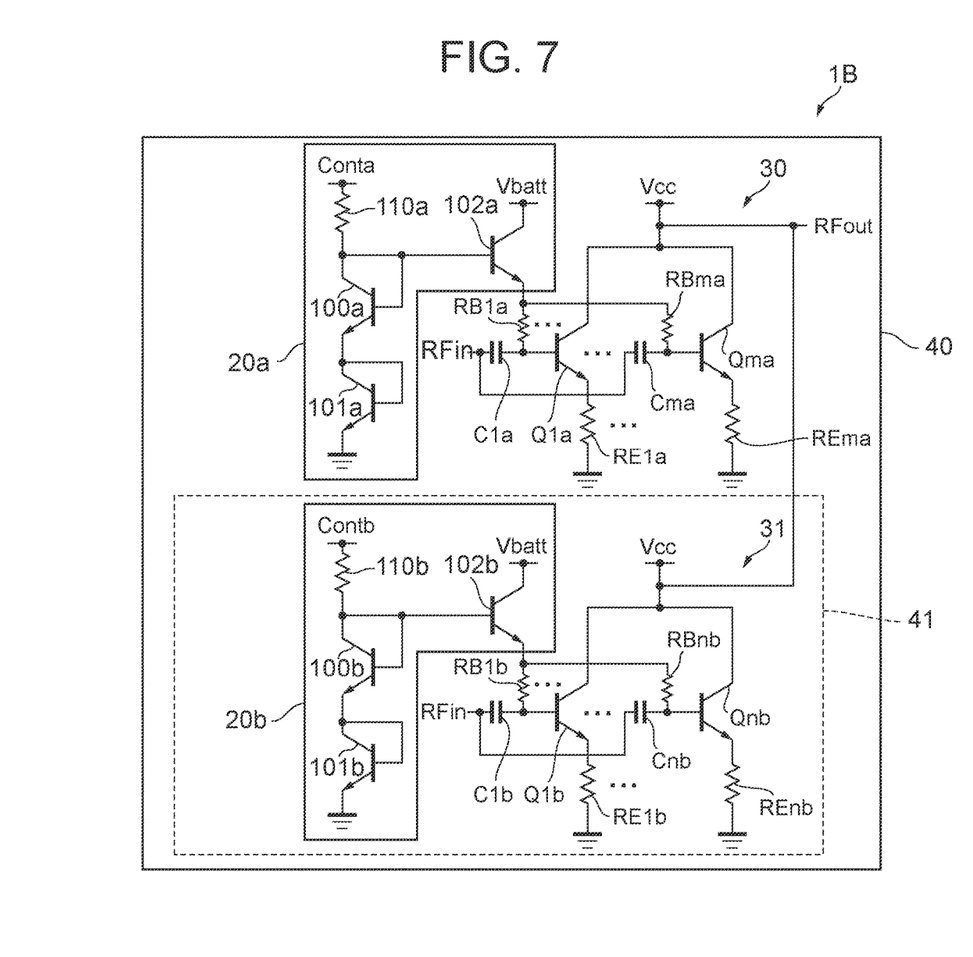
FIG. 7 is a diagram illustrating an example of the circuit diagram of an amplifier and a bias circuit included in a power amplifier circuit according to the second embodiment of the present invention.

FIG. 7 is a diagram illustrating an example of the circuit diagram of amplifiers and bias circuits included in a power amplifier circuit according to the second embodiment of the present invention. More specifically, FIG. 7 illustrates the specific configurations of the amplifiers 30 and 31 in the third stage of the first path and the bias circuit 20 illustrated in FIG. 6.

The amplifier 30 includes, for example, a transistor group (a first transistor group) including an m number (m: an integer of 1 or more) of unit transistors Q1a to Qma, the m number of capacitive elements C1a to Cma, the m number of resistive elements RE1a to REma, the m number of resistive elements RB1a to RBma. The amplifier 31 includes, for example, a transistor group (a second transistor group) including an n number (n: an integer of 1 or more) of unit transistors Q1b to Qnb, the n number of capacitive elements C1b to Cnb, the n number of resistive elements RE1b to REnb (third resistive elements), and the n number of resistive elements RB1b to RBnb. A bias circuit 20a includes, for example, transistors 100a to 102a and a resistive element 110a. A bias circuit 20b includes, for example, transistors 100b to 102b and a resistive element 110b. The configurations of the amplifiers 30 and 31, and the bias circuits 20a and 20b are the same as those of the amplifier 12 and the bias circuit 20 illustrated in FIG. 2, so that the same reference numerals are assigned and the descriptions thereof are omitted. Further, the m that denotes the number of the unit transistors in the amplifier 30 and the n that denotes the number of the unit transistors in the amplifier 31 may be the same or different.

When the power amplifier circuit 1B operates in the high power mode, the constituent elements enclosed by a box 40 (indicated by the solid line) operate. When the power amplifier circuit 1B operates in the low power mode, only the constituent elements enclosed by a box 41 (indicated by the dashed line) operate. The switching between the amplifiers according to the operation mode is implemented by, for example, control signals Conta and Contb supplied to the bias circuits 20a and 20b, respectively.

As with the power amplifier circuit 1A, the power amplifier circuit 1B having the configuration described above can also restrain the uneven temperature distribution among a plurality of unit transistors while restraining a decrease in the output power and the deterioration of the power added efficiency, consequently avoiding the occurrence of the current collapse phenomenon.

Figure 8:
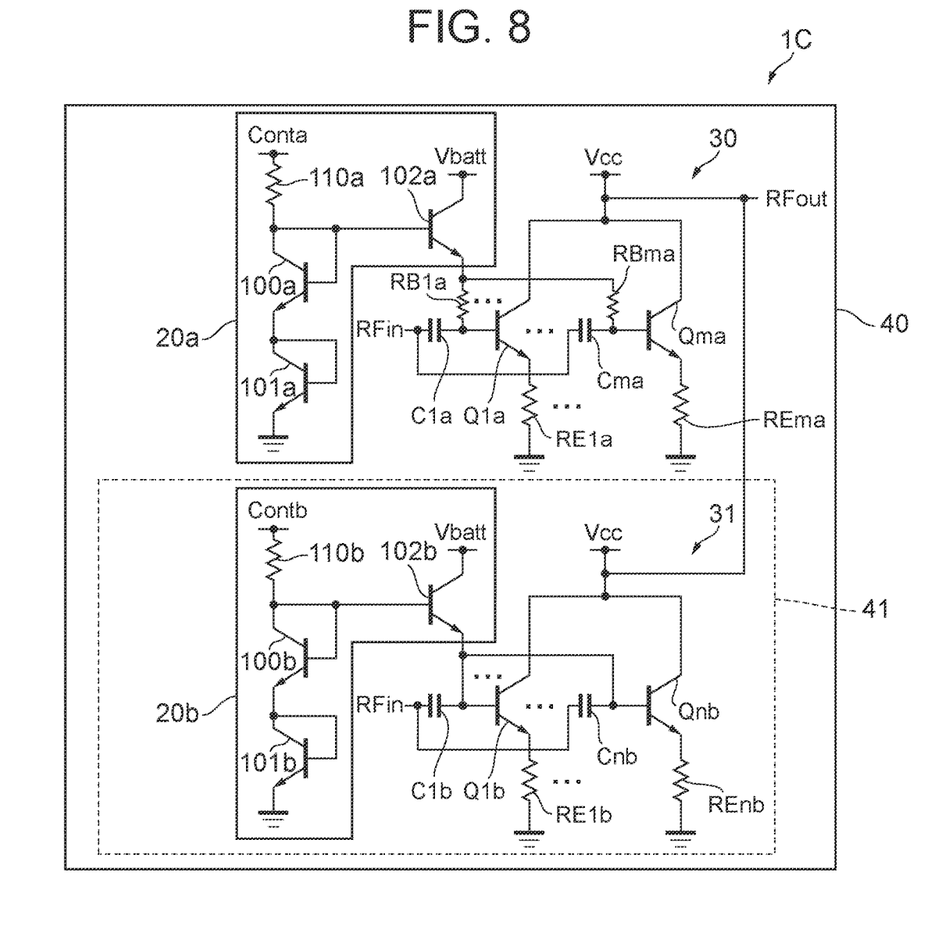
FIG. 8 is a diagram illustrating an example of the circuit diagram of an amplifier and a bias circuit included in a power amplifier circuit according to a third embodiment of the present invention.

FIG. 8 is a diagram illustrating an example of the circuit diagram of amplifiers and bias circuits included in a power amplifier circuit according to a third embodiment of the present invention. A power amplifier circuit 1C illustrated in FIG. 8 differs from the power amplifier circuit 1B illustrated in FIG. 7 in that an amplifier 31 does not have the resistive elements RB1b to RBnb.

In other words, in the power amplifier circuit according to the present embodiment, it is not always necessary to provide all unit transistors with both the emitter ballast resistors and the base ballast resistors. As illustrated in FIG. 8, some transistors may be provided with the emitter ballast resistors and the base ballast resistors, whereas the other transistors may be provided with either the emitter ballast resistors or the base ballast resistors. For example, the power amplifier circuit 1C employs the configuration in which unit transistors Q1a to Qma (i.e., the unit transistors that operate only in the high power mode) are provided with both the emitter ballast resistors and the base ballast resistors, whereas unit transistors Q1b to Qnb (i.e., the unit transistors that operate also in the low power mode) are not provided with the base ballast resistors. This is because the output power is smaller in the low power mode than in the high power mode, so that the temperatures of the unit transistors are less likely to rise, leading to a lower possibility of uneven temperature distribution.

This configuration also enables the power amplifier circuit 1C to restrain the uneven temperature distribution among a plurality of unit transistors while restraining a decrease in output power and the deterioration of the characteristic of power added efficiency thereby to consequently avoid the occurrence of the current collapse phenomenon, as with the power amplifier circuit 1A.

Further, in the power amplifier circuit 1C, some of the unit transistors Q1b to Qnb are not provided with the base ballast resistors, thus enabling the chip area thereof to be reduced, as compared with the power amplifier circuit 1B.

The configurations of the power amplifier circuits 1B and 1C have been described above, in which both the amplifiers 30 and 31 operate in the high power mode, while the amplifier 31 operates in the low power mode; however, the allocation of the operating amplifiers is not limited thereto. An alternative configuration may be applied, in which, for example, the amplifier 30 operates in the high power mode, while the amplifier 31 operates in the low power mode. In this case, the m number of the unit transistors constituting the amplifier 30 is preferably larger than the n number of the unit transistors constituting the amplifier 31 (m>n).

Figure 9:
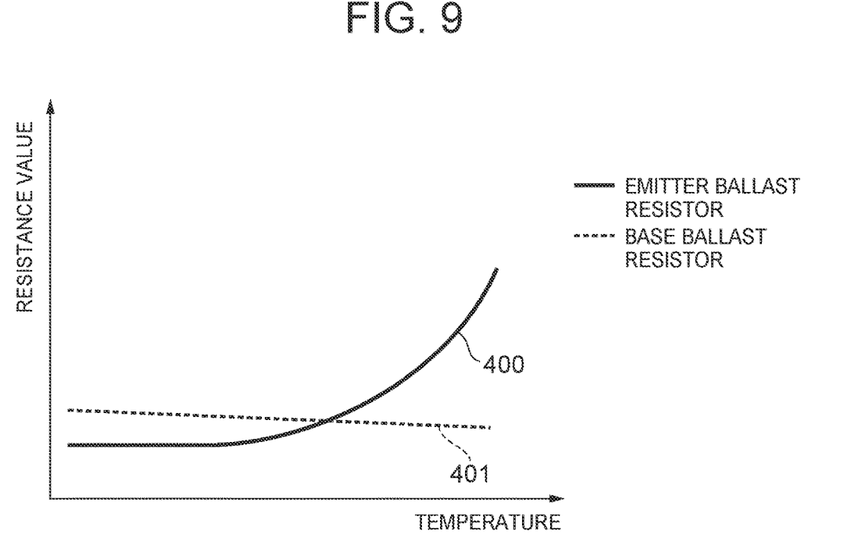
FIG. 9 is a graph with a simplified illustration of the temperature characteristics of an emitter ballast resistor and a base ballast resistor.
Figure 10:
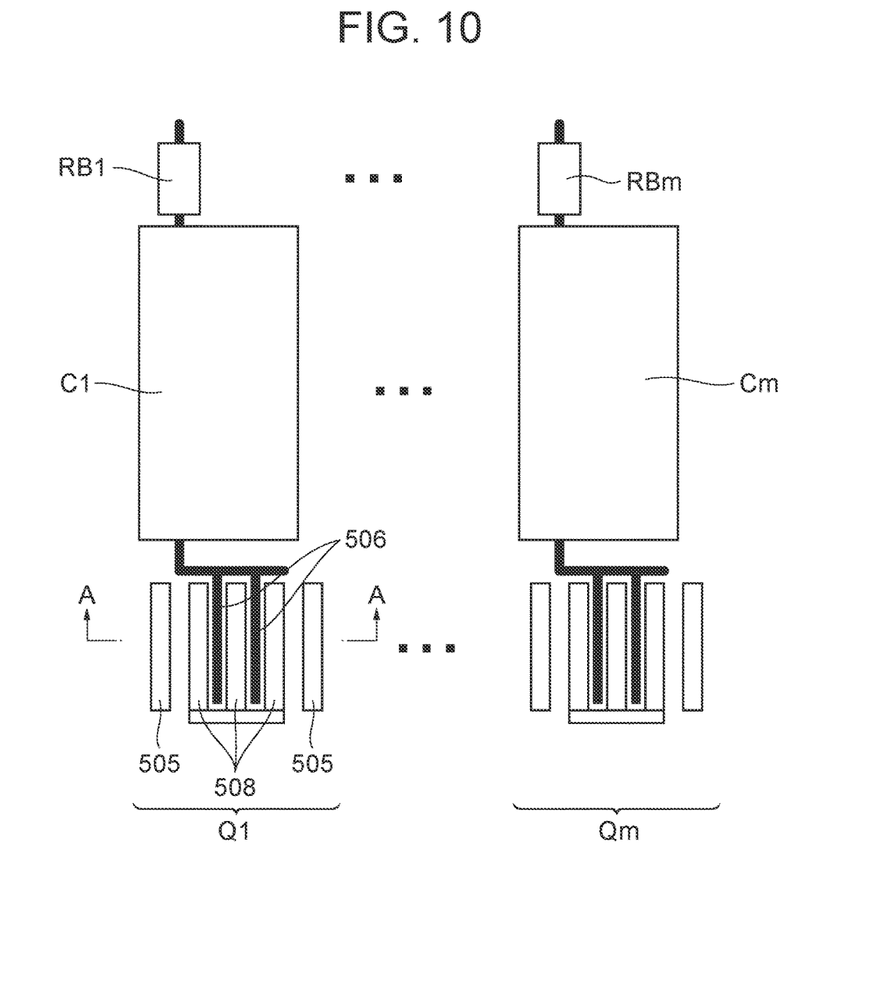
FIG. 10 is a plan view illustrating the layout of transistors and base ballast resistors.
Figure 11:
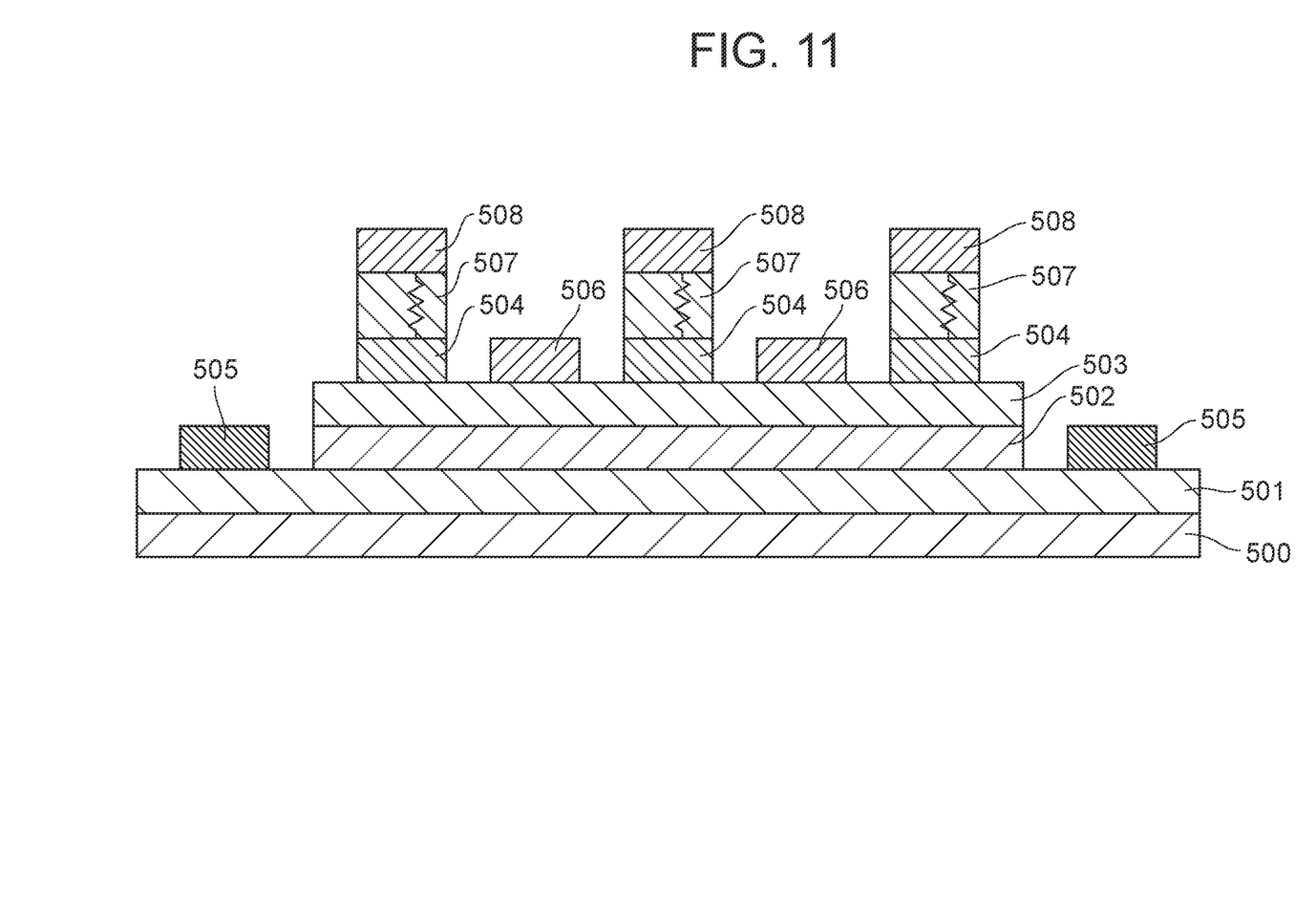
FIG. 11 is a sectional view taken along line A-A of FIG. 10.

Referring now to FIG. 9 to FIG. 11, the layout of the emitter ballast resistors and the base ballast resistors will be described.

FIG. 9 is a graph with a simplified illustration of the temperature characteristics of the emitter ballast resistors and the base ballast resistors. In the graph, the horizontal axis indicates temperature and the vertical axis indicates resistance value. The graph illustrates a temperature characteristic of the emitter ballast resistors (the resistive elements RE1 to REm) 400 and a temperature characteristic of the base ballast resistors (the resistive elements RB1 to RBm) 401 in the power amplifier circuit 1A.

The temperature characteristic 400 indicates that the resistance values of the emitter ballast resistors increase as the temperature increases. On the other hand, the temperature characteristic 401 indicates that the resistance values of the base ballast resistors slowly decrease as the temperature increases. Preferably, therefore, in order to restrain the uneven temperature distribution among the plurality of unit transistors, the emitter ballast resistors are used under a higher temperature condition whereas the base ballast resistors are used under a lower temperature condition. The following will describe an example of the layout of the resistive elements that accomplishes the conditions.

FIG. 10 is a plan view illustrating the layout of the transistors and the base ballast resistors, and FIG. 11 is a sectional view taken along line A-A of FIG. 10.

More specifically, FIG. 10 is a planar view of a principal surface of a semiconductor substrate (not illustrated), on which, for example, the m number of unit transistors Q1 to Qm, the m number of capacitive elements C1 to Cm, and the m number of resistive elements RB1 to RBm are formed. As illustrated in FIG. 10, the unit transistors Q1 to Qm, the capacitive elements C1 to Cm, and the resistive elements RB1 to RBm are aligned in one direction.

FIG. 11 is a sectional view of the unit transistor Q1 among the plurality of unit transistors Q1 to Qm. The unit transistor Q1 includes a sub-collector layer 501, a collector layer 502, a base layer 503, and three emitter layers 504, which are formed in this order on a semiconductor substrate 500. Collector electrodes 505 are formed on both sides of the collector layer 502. Formed on the base layer 503 are base electrodes 506, each of which is formed between adjacent emitter layers 504. Formed on the three emitter layers 504 are resistive elements 507 and emitter electrodes 508.

The resistive elements 507 correspond to the resistive element RE1 illustrated in FIG. 2, and are therefore emitter ballast resistors. In a power amplifier circuit, the unit transistors constituting a transistor are the main heat generation sources. The emitter ballast resistor is provided between the emitter layer 504 and the emitter electrode 508 in each unit transistor. This means that the emitter ballast resistors are provided at positions where the temperatures easily rise.

Meanwhile, as illustrated in FIG. 10 and FIG. 11, the base ballast resistors are formed at positions farther from the unit transistor Q1 than the emitter ballast resistors. For example, taking the resistive element RB1 as an example, a capacitive element C1 is formed to separate the unit transistor Q1, which is the heat generation source, from the resistive element RB1 in the planar view of the semiconductor substrate. Thus, the base ballast resistors are provided at the positions where the temperatures are relatively less prone to rise.

According to the layout described above, the emitter ballast resistors will be used under the condition in which the temperature is relatively high (i.e., a condition in which the resistance value is relatively large), while the base ballast resistors will be used under the condition in which the temperature is relatively low (i.e., a condition in which the resistance value is relatively large). This makes it possible to easily restrain an increase in the current passing through the unit transistors, so that a rise in temperature of the unit transistors can consequently be restrained easily. It should be noted that the layout of the emitter ballast resistors and the base ballast resistors is not limited to this example.

The above has described the embodiments illustrative of the present invention. The power amplifier circuit 1A is provided with the transistor group, which includes the plurality of unit transistors Q1 to Qm and which amplifies an input signal and outputs the amplified signal, the bias circuit 20, which supplies a bias current or a bias voltage to the base or the gate of each of the unit transistors Q1 to Qm of the transistor group, the plurality of resistive elements RB1 to RBm connected between the bases or the gates of the unit transistors Q1 to Qm of the transistor group and the output of the bias circuit 20, and the plurality of resistive elements RE1 to REm connected between the emitters or the sources of the unit transistors Q1 to Qm of the transistor group and the reference potential. With this arrangement, even if the resistance value of an emitter ballast resistor is smaller than the resistance value of the emitter ballast resistor of the comparative example, the rise in temperature of each unit transistor can be restrained. According to the power amplifier circuit 1A, therefore, the uneven temperature distribution among a plurality of unit transistors can be restrained while restraining a decrease in the output power of the power amplifier circuit and the deterioration of the characteristic of power added efficiency, thus making it possible to avoid the occurrence of the current collapse phenomenon.

Further, the power amplifier circuit 1C is provided with the transistor group, which includes the plurality of unit transistors Q1$b$ to Qnb to amplify an input signal and output the amplified signal, and is further provided with the plurality of resistive elements RE1$b$ to REnb connected to the emitters or the sources of the unit transistors Q1$b$ to Qnb of the transistor group and the reference potential. If the operation mode of the power amplifier circuit 1C is the first mode, in which power of a predetermined level or more is output, then the unit transistors Q1$a$ to Qma of the transistor group and the unit transistors Q1$b$ to Qnb of the transistor group are turned on. If the operation mode is the second mode, in which power below the predetermined level is output, then the unit transistors Q1$a$ to Qma of the transistor group are turned off, whereas the unit transistors Q1$b$ to Qnb of the transistor group are turned on. Thus, in the power amplifier circuit 1C, some unit transistors among Q1$b$ to Qnb are not provided with base ballast resistors, so that the chip area can be reduced, as compared with the power amplifier circuit 1B.

Further, the power amplifier circuit 1A is formed on the semiconductor substrate 500, and the plurality of resistive elements RB1 to RBm are formed on the semiconductor substrate 500 at the positions away from the unit transistors Q1 to Qm of the transistor group, as compared with the plurality of resistive elements RE1 to REm. Thus, the emitter ballast resistors will be used under the condition in which the temperature is relatively high, while the base ballast resistors will be used under the condition in which the temperature is relatively low. This makes it possible to easily restrain an increase in the current passing through the unit transistors, so that a rise in temperature of the unit transistors can consequently be restrained easily.

Further, input signals are supplied to one end of the power amplifier circuit 1A and the other end thereof is further provided with the plurality of capacitive elements C1 to Cm connected to the bases or the gates of the unit transistors Q1 to Qm of the transistor group. In the planar view of the semiconductor substrate 500, the plurality of capacitive elements C1 to Cm are formed between the unit transistors Q1 to Qm of the transistor group and the plurality of resistive elements RB1 to RBm. With this arrangement, the capacitive elements separate the unit transistors, which are the heat generation sources, and the base ballast resistors, thus restraining the temperature of the base ballast resistors from increasing.

The foregoing embodiments illustrate the power amplifier circuits 1A to 1C being provided with the three stages of amplifiers in each amplification path, and the emitter ballast resistors and the base ballast resistors are applied to the amplifiers in the third stages. However, the amplifiers to which the emitter ballast resistors and the base ballast resistors are applied are not limited to those in the third stages, and may alternatively be those in the first stages or the second stages. Further, the number of stages of the amplifiers is not limited to three, and may alternatively be one, two or four or more. In the case where power is amplified through a plurality of amplifiers, the output power of an amplifier in a final stage is the largest, and the temperatures of the transistors in the final stage most easily increase. For this reason, applying the emitter ballast resistors and the base ballast resistors to the amplifiers in the final stage and applying either the emitter ballast resistors or the base ballast resistors to the amplifiers in the remaining stages makes it possible to minimize an increase in the chip area.

The embodiments described above are intended for easy understanding of the present invention and are not to be interpreted as limiting the present invention. The present invention may be modified or improved without departing from the spirit of the present invention, and equivalents thereof are also covered by the present invention. In other words, those obtained by adding design changes, as appropriate, to the embodiments by persons skilled in the art are encompassed by the scope of the present invention insofar as the characteristics of the present invention are incorporated. For example, the elements provided in the embodiments, and the placement, the materials, the conditions, the shapes, the sizes, and the like of the elements are not limited to the illustrated ones and may be changed, as appropriate. Further, the elements provided in the embodiments may be combined insofar as the combinations are technologically possible, and such combinations are to be covered by the scope of the present invention insofar as the characteristics of the present invention are incorporated.

DESCRIPTION OF REFERENCE NUMERALS 1A to 1C . . . Power amplifier circuit; 10 to 15, 30 to 33 . . . Amplifier; 20 (20a, 20b) . . . Bias circuit; 100 to 102 (100a to 102a, 100b to 102b) . . . Transistor; 110 (110a, 110b) . . . Resistive element; 300 . . . Transistor group; 500 . . . Semiconductor substrate; 501 . . . Sub-collector layer; 502 . . . Collector layer; 503 . . . Base layer; 504 . . . Emitter layer; 505 . . . Collector electrode; 506 . . . Base electrode; 507 . . . Resistive element; 508 . . . Emitter electrode; Q1 to Qm (Q1a to Qma, Q1b to Qnb) . . . Unit transistor; C1 to Cm (C1a to Cma, C1b to Cnb) . . . Capacitive element; and RE1 to REm (RE1a to REma, RE1b to REnb), RB1 to RBm (RB1a to RBma, RB1b to RBnb), and RBx . . . Resistive element.

What is claimed is:

1. A power amplifier circuit comprising:
a first transistor group comprising a plurality of unit transistors, and configured to amplify an input signal and output an amplified signal;
a bias circuit configured to supply a bias current or a bias voltage to a base or a gate of each of the plurality of unit transistor of the first transistor group;
a plurality of first resistive elements for each of the plurality of unit transistors of the first transistor group, each of the plurality of resistive elements being connected between the base or the gate of a respective unit transistor of the first transistor group and an output of the bias circuit;
a plurality of second resistive elements for each of the plurality of unit transistors of the first transistor group, each of the plurality of second resistive elements being connected between an emitter or a source of a respective unit transistor of the first transistor group and a reference potential;
a second transistor group comprising a second plurality of unit transistors and configured to amplify the input signal and output the amplified signal; and
a plurality of third resistive elements for each of the second plurality of unit transistors of the second transistor group, each of the plurality of third resistive elements connected between an emitter or a source of a respective unit transistor of the second transistor group and a reference potential, wherein:
when the power amplifier circuit outputs the amplified signal at or above a predetermined power level, the plurality of unit transistors of the first transistor group and the second plurality of unit transistors of the second transistor group are turned on, and
when the power amplifier circuit outputs the amplified signal at less than the predetermined power level, the plurality of unit transistors of the first transistor group are turned off, and the second plurality of unit transistors of the second transistor group are turned on.

2. A power amplifier circuit comprising:
a first transistor group comprising a plurality of unit transistors, and configured to amplify an input signal and output an amplified signal;
a bias circuit configured to supply a bias current or a bias voltage to a base or a gate of each of the plurality of unit transistor of the first transistor group;
a plurality of first resistive elements for each of the plurality of unit transistors of the first transistor group, each of the plurality of resistive elements being connected between the base or the gate of a respective unit transistor of the first transistor group and an output of the bias circuit; and
a plurality of second resistive elements for each of the plurality of unit transistors of the first transistor group, each of the plurality of second resistive elements being connected between an emitter or a source of a respective unit transistor of the first transistor group and a reference potential, wherein:
the power amplifier circuit is formed on a semiconductor substrate, and
at least one of the plurality of first resistive elements is formed on the semiconductor substrate further away from the respective unit transistor of the first transistor group, than a corresponding at least one of the plurality of second resistive elements.

3. A power amplifier circuit comprising:
a first transistor group comprising a plurality of unit transistors, and configured to amplify an input signal and output an amplified signal;
a bias circuit configured to supply a bias current or a bias voltage to a base or a gate of each of the plurality of unit transistor of the first transistor group;
a plurality of first resistive elements for each of the plurality of unit transistors of the first transistor group, each of the plurality of resistive elements being connected between the base or the gate of a respective unit transistor of the first transistor group and an output of the bias circuit;

a plurality of second resistive elements for each of the plurality of unit transistors of the first transistor group, each of the plurality of second resistive elements being connected between an emitter or a source of a respective unit transistor of the first transistor group and a reference potential; and a plurality of capacitive elements for each of the plurality of unit transistors, one end of each of the plurality of capacitive elements being supplied with the input signal, and another end of each of the plurality of capacitive elements being connected to the base or the gate of a respective unit transistor of the first transistor group.

4. The power amplifier circuit according to claim 2, further comprising:

a plurality of capacitive elements for each of the plurality of unit transistors, one end of each of the plurality of capacitive elements being supplied with the input signal, and another end of each of the plurality of capacitive elements being connected to the base or the gate of a respective unit transistor of the first transistor group.

5. The power amplifier circuit according to claim 4, wherein, in a planar view of the semiconductor substrate, the plurality of capacitive elements are formed between the unit transistors of the first transistor group and the plurality of first resistive elements.

6. A power amplifier circuit comprising:

a first transistor group comprising a plurality of unit transistors, and configured to amplify an input signal and output an amplified signal;

a bias circuit configured to supply a bias current or a bias voltage to a base or a gate of each of the plurality of unit transistor of the first transistor group;

a plurality of first resistive elements for each of the plurality of unit transistors of the first transistor group, each of the plurality of resistive elements being connected between the base or the gate of a respective unit transistor of the first transistor group and an output of the bias circuit;

a plurality of second resistive elements for each of the plurality of unit transistors of the first transistor group, each of the plurality of second resistive elements being connected between an emitter or a source of a respective unit transistor of the first transistor group and a reference potential; and a resistive element connected at one end to the output of the bias circuit and at another end to each of the plurality of first resistive elements.

7. The power amplifier circuit according to claim 1, wherein the reference potential is ground.

8. The power amplifier circuit according to claim 1, wherein the plurality of unit transistors of the first transistor group are heterojunction bipolar transistors.

9. The power amplifier circuit according to claim 1, wherein the plurality of unit transistors of the first transistor group, and the second plurality of unit transistors of the second transistor group, are heterojunction bipolar transistors.

10. The power amplifier circuit according to claim 2, wherein the reference potential is ground.

11. The power amplifier circuit according to claim 2, wherein the plurality of unit transistors of the first transistor group are heterojunction bipolar transistors.

12. The power amplifier circuit according to claim 3, wherein the reference potential is ground.

13. The power amplifier circuit according to claim 3, wherein the plurality of unit transistors of the first transistor group are heterojunction bipolar transistors.

14. The power amplifier circuit according to claim 6, wherein the reference potential is ground.

15. The power amplifier circuit according to claim 6, wherein the plurality of unit transistors of the first transistor group are heterojunction bipolar transistors.

* * * * *